(12) United States Patent
Tsurumi et al.

(10) Patent No.: US 6,501,241 B1
(45) Date of Patent: Dec. 31, 2002

(54) CURRENT DETECTOR USED IN SYSTEM OF CONTROLLING MOTOR FOR DRIVING VEHICLE

(75) Inventors: Takafumi Tsurumi, Wako (JP); Yasumichi Ohnuki, Wako (JP)

(73) Assignee: Honda Giken Kogyo Kabushiki Kaishi, Tokyo (JP)

( * ) Notice: Subject to any disclaimer, the term of this patent is extended or adjusted under 35 U.S.C. 154(b) by 0 days.

(21) Appl. No.: 09/692,307

(22) Filed: Oct. 20, 2000

(30) Foreign Application Priority Data

Oct. 29, 1999 (JP) .......................................... 11-310350

(51) Int. Cl.[7] .............................................. H02P 17/32
(52) U.S. Cl. ........................ 318/432; 318/474; 318/430
(58) Field of Search ................................. 318/430, 432, 318/474; 388/903, 809

(56) References Cited

U.S. PATENT DOCUMENTS

| | | | |
|---|---|---|---|
| 4,225,815 A | * 9/1980 | Lind et al. | 320/39 |
| 4,947,123 A | * 8/1990 | Minezawa | 324/427 |
| 4,996,625 A | * 2/1991 | Soma et al. | 361/87 |
| 5,337,013 A | * 8/1994 | Langer et al. | 324/537 |
| 5,345,158 A | 9/1994 | Kliman et al. | 318/434 |
| 5,367,599 A | * 11/1994 | Okada | 388/809 |
| 5,734,264 A | * 3/1998 | Berna et al. | 324/117 H |
| 5,965,991 A | * 10/1999 | Koike et al. | 318/139 |
| 6,016,042 A | * 1/2000 | Miura et al. | 318/430 |
| 6,018,700 A | * 1/2000 | Edel | 702/60 |
| 6,285,191 B1 | * 9/2001 | Gollomp et al. | 324/427 |

FOREIGN PATENT DOCUMENTS

| | | |
|---|---|---|
| DE | 3942167 C2 | 12/1989 |
| DE | 2226888 A | 7/1990 |
| DE | 4410180 A1 | 3/1995 |
| DE | 95/25959 | 9/1995 |
| GB | 4332555 A1 | 9/1993 |

OTHER PUBLICATIONS

Sedra & Smith, "Microelectronic Circuits", Second Edition, N.Y., HRW, 1987, pp. 133–134.*

* cited by examiner

Primary Examiner—Robert E. Nappi
Assistant Examiner—Rina I. Duda
(74) Attorney, Agent, or Firm—Armstrong, Westerman & Hattori, LLP

(57) ABSTRACT

A current detector used in a control system for controlling a motor for driving a vehicle is disclosed, which does not require an especially accurate power circuit, and an accurate measurement result can be obtained by using a cheap power circuit whose accuracy is relatively low. The current detector comprises a detector for outputting a voltage corresponding to a target current, wherein the detector has a current detecting element for detecting the target current; an amplifier for amplifying and outputting the output from the detector; an analog-digital converter for converting the output from the amplifier to a digital data; and a power circuit for supplying an output voltage to both the detector and the analog-digital converter.

6 Claims, 6 Drawing Sheets

CURRENT DETECTOR USED IN SYSTEM OF CONTROLLING MOTOR FOR DRIVING VEHICLE

BACKGROUND OF THE INVENTION

1. Field of the Invention

The present invention relates to a current detector used in a control system for controlling a motor for driving a vehicle such as an electric vehicle or a hybrid vehicle, or for use in another system which requires current detection.

2. Description of the Related Art

FIG. 4 is a block diagram showing the structure of a conventional current detector used in a control system for controlling a motor for driving a vehicle. In this figure, reference numeral 1 indicates a current sensor using a Hall element. The Hall element has a function of outputting a voltage which is proportional to (i) flowing current and (ii) generated magnetic flux density.

FIG. 5 is a block diagram showing the structure of the current sensor 1. In the figure, reference numeral 7 indicates a Hall element. Reference numeral 8 indicates a core which generates a magnetic flux when current flows through wire L. Reference numeral 9 indicates a power circuit which receives 12 V voltage, and converts it to 5 V voltage and outputs the converted voltage. Reference numeral 10 indicates an amplification circuit which is driven using the 5 V voltage output from the power circuit 9. When voltage v1 is input from Hall element 7 to the amplification circuit 10, the circuit 10 amplifies voltage v1 and also adds an offset voltage to the amplified voltage, and outputs the amplified voltage including the offset as voltage v2. Reference numeral 11 indicates a constant current generating circuit for supplying a constant current to the Hall element 7. The 5 V voltage output from the power circuit 9 is supplied to the constant current generating circuit 11 as a reference voltage, and the above constant current is defined by potential-dividing the reference voltage by using a resistor.

In FIG. 4, reference numeral 3 indicates an A/D converter which receives voltage input via terminal C from current sensor 1, and calculates the ratio of the input voltage to a reference voltage input from the power circuit 4, and converts the ratio to a digital value, and outputs the digital value. Here, the power circuit 4 converts input 12 V voltage to 5 V voltage and supplies the 5 V voltage to the A/D converter 3. Reference numeral 5 indicates a CPU (central processing unit) for receiving the above digital value from the A/D converter, and calculates and outputs the value indicating a target current flowing through wire L. Reference numeral 6 indicates a power circuit for driving CPU 5.

Below, the operation of the current detector (used in a control system for controlling a motor for driving a vehicle) having the above-explained structure will be explained.

When a 12 V voltage is input via terminal B to current sensor 1, the power circuit 9 converts the 12 V voltage to 5 V voltage and outputs the converted voltage to the Hall element 7 and the constant current generating circuit 11.

On the other hand, when a target current to be measured flows through wire L, magnetic flux is generated in core 8. When the magnetic flux is applied to Hall element 7, the element 7 outputs voltage v1, proportional to the magnetic flux, to the amplification circuit 10. The amplification circuit 10 amplifies the input voltage v1 and adds an offset voltage to it so as to obtain voltage v2 (0 V $\leq$ v2 $\leq$ 5.0 V), and outputs voltage v2 via terminal C to A/D converter 3.

When the A/D converter 3 receives voltage v2 via terminal C, the converter 3 calculates the ratio of v2 to the reference voltage (i.e., 5V) input via terminal A from the power circuit 4, and converts the calculated result to a digital value and outputs the digital value to CPU 5.

In order to improve the accuracy of the current sensor 1, a constant current (from the constant current generating circuit) should be stable, that is, should not be affected by the external environment. Accordingly, the voltage supplied to the constant current generating circuit should be accurate, and thus an accurately operable power circuit must be used as power circuit 9.

In addition, the A/D converter 3 should also accurately digitize the measurement value of the current sensor 1, and thus the power circuit 4 should also be accurate.

Therefore, conventionally, in order to accurately measure the target current, both the power circuits 4 and 9 must be accurate, thus the cost will be high.

In addition, the values of reference voltage (5 V) of the power circuits may not accurately be the same, thereby producing an error.

Furthermore, in the control of the motor for driving a vehicle, such an error of the current sensor certainly causes an error in the torque control of the motor. More specifically, the difference between the real value and the actually detected value functions as an error of the control value, so that overestimates or underestimates of the control may cause a shock to the vehicle, or excessive discharging or charging of the battery functioning as a power source.

Therefore, for example, the system must be designed in consideration of an error in the detected current; thus, the design may be limited or the system cost may be high.

SUMMARY OF THE INVENTION

In consideration of the above circumstances, an objective of the present invention is to provide a current detector used in a control system for controlling a motor for driving a vehicle, wherein accurate current measurement can be performed without using especially accurate power circuits (as explained above).

Therefore, the present invention provides a current detector used in a control system for controlling a motor for driving a vehicle comprising:

- a detector (for example, a current sensor 21 in the following embodiment) for outputting a voltage corresponding to a target current, wherein the detector has a current detecting element (for example, a Hall element 27 in the following embodiment) for detecting the target current;
- an amplifier (for example, an amplification circuit 30 in the following embodiment) for amplifying and outputting the output from the detector;
- an analog-digital converter (for example, an A/D converter 23 in the following embodiment) for converting the output from the amplifier to a digital data; and
- a power circuit (for example, a power circuit 33 in the following embodiment) for supplying an output voltage to both the detector and the analog-digital converter.

In a typical example, the detector comprises:

- a Hall element (for example, a Hall element 27 in the following embodiment) functioning as the current detecting element;
- a core (for example, a core 28 in the following embodiment) for applying a magnetic flux corresponding to the target current to the Hall element; and a constant current generating circuit (for example, a constant current generating circuit 31 in the following embodiment) for supplying a constant current to the Hall element.

Preferably, the amplifier adds an offset voltage to the amplified voltage, and outputs the amplified voltage including the offset.

Also typically, the vehicle is a hybrid vehicle which uses the motor for assisting the output of an engine.

According to the present invention, the output voltage from a single power circuit is supplied to the detector for detecting the target current and to the analog-digital converter; thus, an especially accurate power circuit is not necessary, and an accurate measurement result can be obtained by using a cheap power circuit whose accuracy is relatively low.

DESCRIPTION OF THE PREFERRED EMBODIMENTS

Hereinafter, an embodiment according to the present invention will be explained in detail with reference to the drawings.

Figure 6:
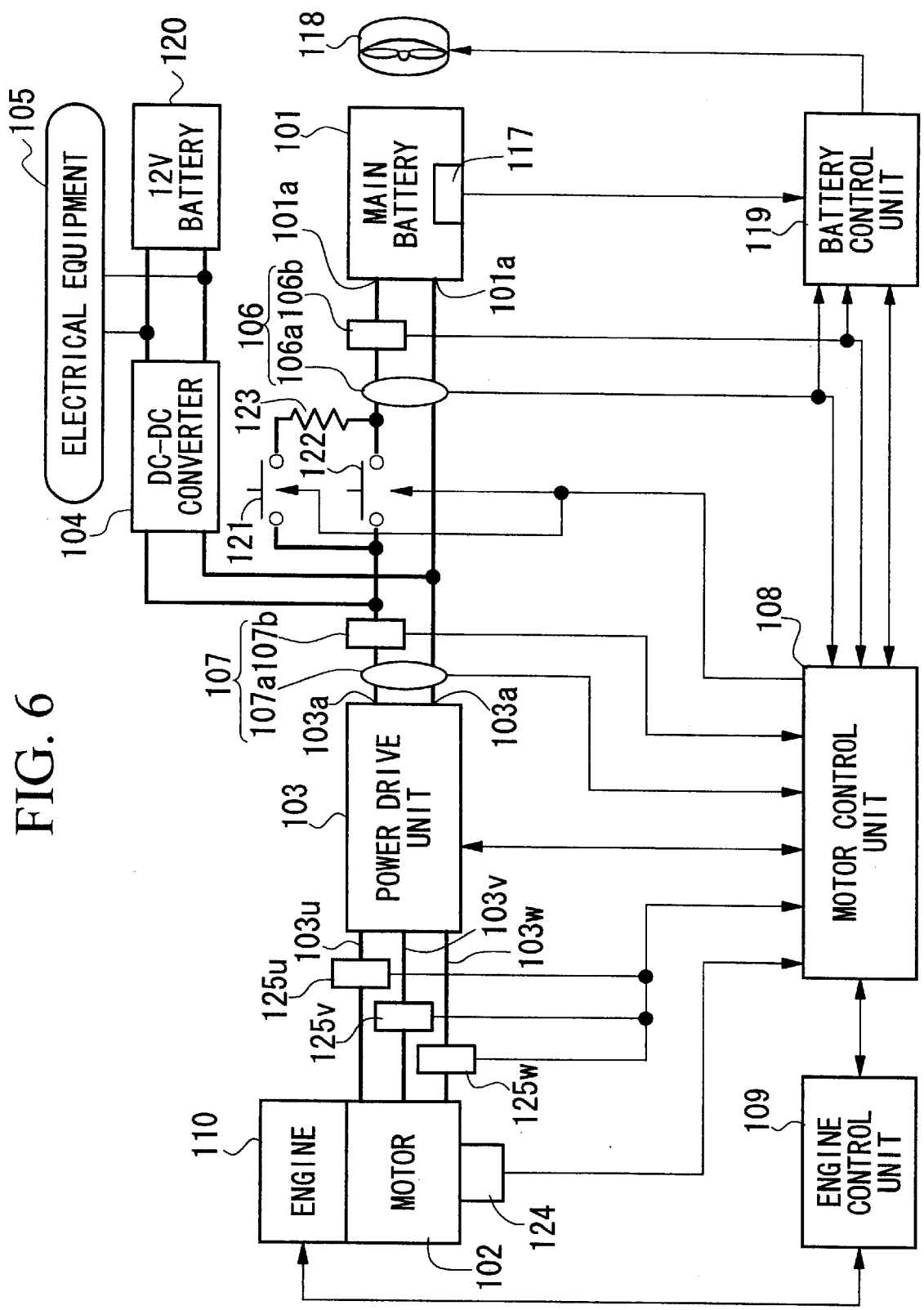
FIG. 6 is a block diagram showing a control system of a parallel hybrid vehicle to which the current detector according to the present invention is applied.

FIG. 6 is a block diagram showing a control system of a parallel hybrid vehicle (a kind of hybrid vehicle) to which a current detector according to the present invention is applied. In this figure, reference numeral 110 indicates an engine which operates by burning suitable amounts of fuel, and reference numeral 102 indicates a motor used together with the engine, and the motor 102 is operated using electric energy. The driving force generated by both the engine 110 and motor 102 is transmitted via a transmission (not shown: automatic or manual transmission) to driving wheels (also, not shown). When the vehicle decelerates, the rotation of the driving wheels is transmitted to the motor 102, and the motor 102 functions as a generator, so that the kinetic energy of the vehicle body is recovered and stored as electric energy.

Reference numeral 101 indicates a main battery for supplying electric power to motor 102 when the vehicle is driven using the driving force of motor 102. As explained above, the motor 102 functions as a generator in deceleration (of the vehicle) or the like, and the main battery 101 stores electric energy obtained by the generation using motor 102. The main battery 101 includes a plurality of modules connected in series, and in each module, a plurality of cells are connected in series, so as to output a high voltage (here, 144 V). A temperature sensor 117 is attached to each module of the main battery 101, and the modules are contained in a battery box which comprises an air inlet and air outlet for air-cooling the modules. In addition, cooling fan 118 is provided at the air outlet. The air inlet of the battery box is positioned suitably for taking in air from inside of the vehicle, while the air outlet is positioned suitably for discharging the air expelled by the cooling fan 118 to the outside of the vehicle.

Reference numeral 109 indicates an engine control unit which monitors the engine speed Ne, the vehicle speed, the degree of depression Ap of the accelerator pedal, and the like at predetermined intervals. Based on the monitored result, a driving mode determining section (not shown) included in the engine control unit 109 determines the driving mode of the vehicle. The present vehicle has four driving modes: (i) an assist mode in which the vehicle is accelerated, (ii) a deceleration mode in which the vehicle is decelerated, (iii) a cruise mode in which the vehicle drives at a fixed speed, and (iv) an idle mode in which the vehicle is stopped while the engine is active.

The engine control unit 109 also sends data related to the driving mode to motor control unit 108. When the motor control unit 108 receives the data related to the driving mode from the engine control unit 109, a gain switching section (not shown) in the control unit 108 switches (i.e., selects) the gain based on the data, and a feedback processing section (also not shown) controls a power drive unit 103 according to the selected gain, so that the power drive unit 103 controls the amount of electric power sent to or received from motor 102.

Reference numeral 119 indicates a battery control unit, which calculates the remaining battery charge (called "SOC (state of charge)") of main battery 101. In order to protect main battery 101, the battery control unit 119 also controls the cooling fan 118 built into the battery box which contains the main battery 101. In this control, the temperature of the main battery 101 is maintained equal to or below a predetermined value.

The above engine control unit 109, motor control unit 108, and battery control unit 119 are realized using a CPU (central processing unit) and a memory, and the function of each control unit is realized by executing a specific software program.

Reference numeral 103 indicates a power drive unit comprising three parallel-connected sets of two switching elements which are connected in series. The ON/OFF switching operations of the switching elements in the power drive unit 103 are performed by a feedback processing section (not shown) provided in the motor control unit 108. According to the ON/OFF switching operations, the direct current supplied from the main battery 101 to the power drive unit 103 is converted to three-phase alternating current, and the converted three-phase alternating current is supplied to the motor 102 via three phase lines 103$u$, 103$v$, and 103$w$.

Reference numeral 120 indicates a 12V battery for driving various kinds of electrical equipment 105. This 12V battery 120 is connected via DC-DC converter 104 to the lines for connecting the main battery 101 and the power drive unit 103. The DC-DC converter 104 reduces the voltage (144 V) supplied from main battery 101 to 12 V, and supplies the reduced voltage to the electrical equipment 105 and 12V battery 120.

Reference numeral 121 indicates a precharge contactor, and reference numeral 122 indicates a main contactor. The main battery 101 and the power drive unit 103 are connected via these contactors. The ON/OFF switching operations of the precharge contactor 121 and main contactor 122 are performed by the motor control unit 108. Reference numeral 123 indicates a resistor for limiting the precharge current to the main battery 101 at the precharge operation, that is, when the precharge contactor 121 is switched on.

Reference numeral 124 indicates a rotation sensor for detecting the speed of rotation of motor 102. Reference numerals 125u, 125v, and 125w indicate current detectors in the present control system for controlling the motor for driving the vehicle, and current detectors 125u, 125v, and 125w respectively detect currents flowing through three phase lines 103u, 103v, and 103w. The rotation speed detected by the rotation speed sensor 124 and the current values detected by the above current detectors 125u, 125v, and 125w are input into the motor control unit 108. The internal structure of each current detector (125u, 125v, and 125w) will be explained later in detail with reference to FIG. 1.

Reference numeral 106a indicates a voltage sensor positioned very close to the terminals 101a of the main battery 101, between the terminals 101a of the main battery 101 and the terminals 103a of the power drive unit 103. Reference numeral 106b indicates a current sensor positioned very close to a terminal 101a of the main battery 101. That is, the voltage sensor 106a detects the voltage between the terminals 101a of the main battery 101, while the current sensor 106b detects the current flowing through the relevant terminal 101a of the main battery 101. These two sensors, that is, voltage sensor 106a and current sensor 106b, form the first power detecting section 106. The voltage value detected by the voltage sensor 106a and the current value detected by the current sensor 106b are input into the motor control unit 108 and the battery control unit 119.

Reference numeral 107a indicates a voltage sensor positioned very close to the terminals 103a of the power drive unit 103, between the terminals 101a of the main battery 101 and the terminals 103a of the power drive unit 103. Reference numeral 107b indicates a current sensor positioned very close to a terminal 103a of the power drive unit 103. That is, the voltage sensor 107a detects the voltage between the terminals 103a of the power drive unit 103, while the current sensor 107b detects the current flowing through the relevant terminal 103a of the power drive unit 103. These two sensors, that is, voltage sensor 107a and current sensor 107b, form the second power detecting section 107. The voltage value detected by the voltage sensor 107a and the current value detected by the current sensor 107b are input into the motor control unit 108.

The DC-DC converter 104 is connected to a position between current sensors 106b and 107b which are provided on the line for connecting the relevant terminal 101a of the main battery 101 and the relevant terminal 103a of the power drive unit 103; thus, the current detected by the current sensor 107b is the sum of the current detected by the current sensor 106b and the current flowing through the DC-DC converter 104.

Below, the operation of the control system of the hybrid vehicle, having the above-explained structure, will be explained. First, the battery control unit 119 calculates the-remaining battery charge SOC of the battery 101 based on the current and voltage at the terminals 101a of main battery 101, and sends the calculated value to the motor control unit 108. The motor control unit 108 sends the received SOC to the engine control unit 109.

A target power calculating section (not shown) provided in the engine control unit 109 calculates a target power value based on the remaining battery charge SOC, the degree of depression Ap of the accelerator pedal, engine speed Ne, vehicle speed, air-intake passage (negative) pressure Pb, the ON/OFF state of the engine, and the like. In addition, a driving mode determining section (not shown) determines the current driving mode of the vehicle, among the assist mode, deceleration mode, cruise mode, and idle mode.

According to the target power, the feedback processing section (not shown) provided in the motor control unit 108 calculates the power necessary for the motor 102. In addition, when the motor control unit 108 receives data related to the driving mode from the engine control unit 109, the control unit 108 performs control operation suitable for the driving mode. More specifically, when the driving mode is the assist or deceleration mode, the motor control unit 108 executes a feedback control for matching the power measured at the terminals 103a of the power drive unit 103, that is, the power detected by the second power detecting section 107, to the above target power. On the other hand, when the driving mode is the cruise or idle mode, the motor control unit 108 executes a feedback control for matching the power measured at the terminals 101a of the main battery 101, that is, the power detected by the first power detecting section 106, to the above target power. In addition, when the engine 110 is started, the motor control unit 108 controls the power drive unit 103 so as to control the start operation of engine 110 by using the motor 102.

The engine control unit 109, motor control unit 108, and battery control unit 119 operate as explained above at predetermined operation timing so as to control the engine 110, motor 102, and main battery 101, thereby controlling the hybrid vehicle.

FIG., 1 is a block diagram showing the structure of current detector 125u (see FIG. 6) in the above control system for controlling the motor for driving the vehicle. Here, the other current detectors 125v, and 125w have the same structure.

Figure 1:
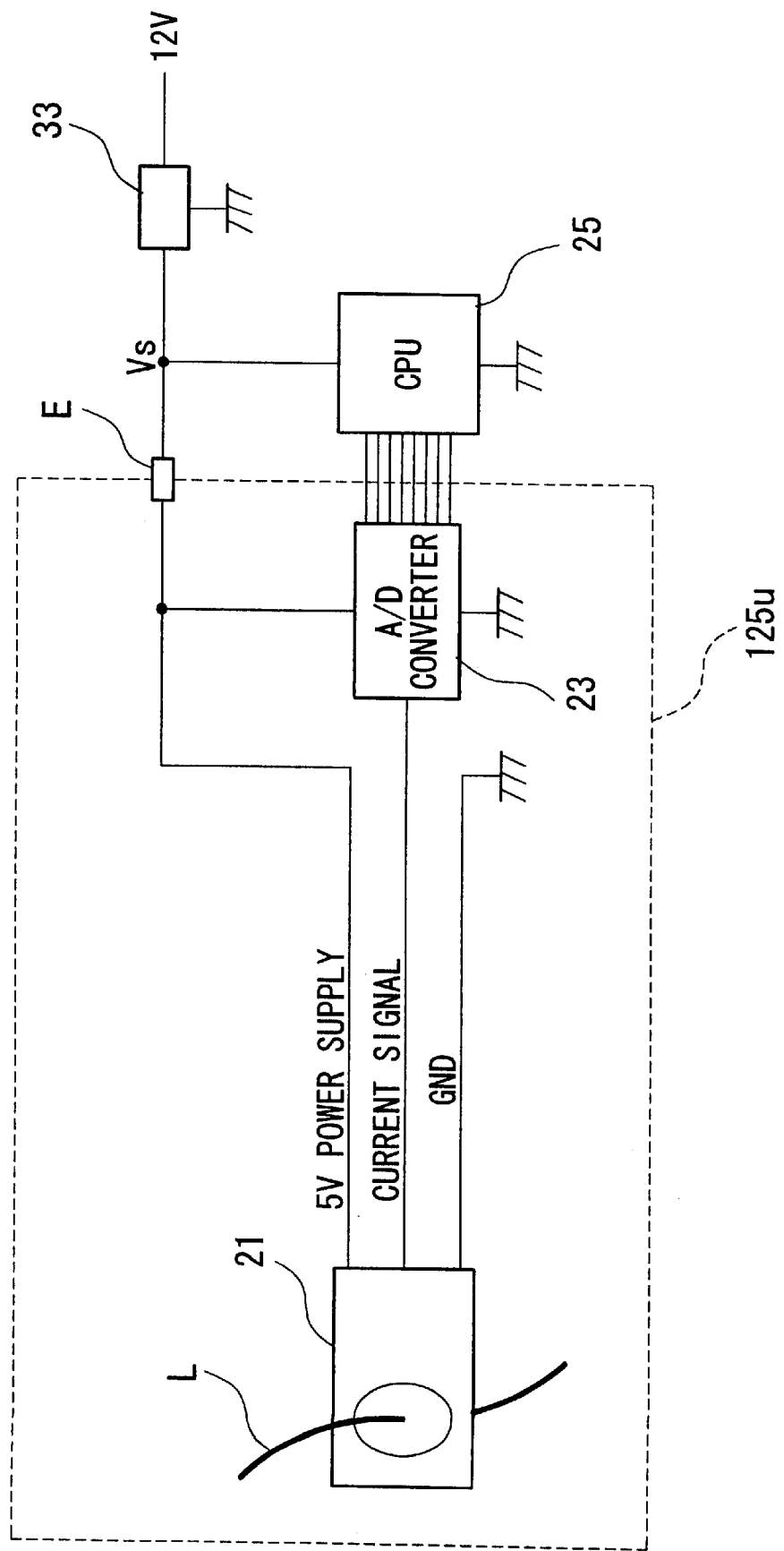
FIG. 1 is a block diagram showing the structure of an embodiment of the current detector used in a control system for controlling a motor for driving a vehicle, according to the present invention.

In FIG. 1, reference numeral 21 indicates a current sensor using a Hall element.

Figure 2:
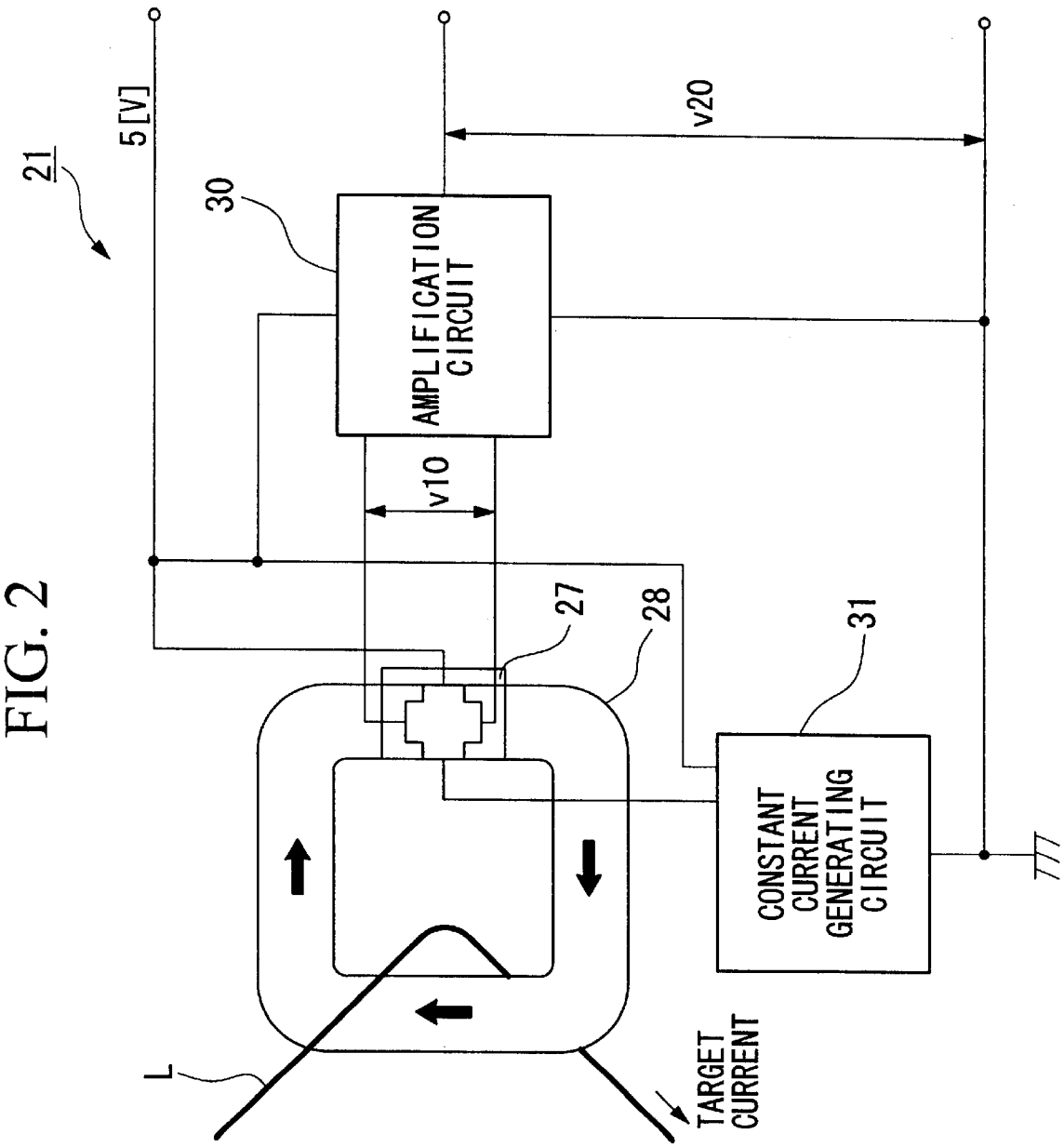
FIG. 2 is a block diagram for showing the structure of a current sensor as a constituent of the current detector shown in FIG. 1.

FIG. 2 is a block diagram showing the structure of current sensor 21. In the figure, reference numeral 27 indicates a Hall element, reference numeral 28 indicates a core, reference numeral 30 indicates an amplification circuit, and reference numeral 31 indicates a constant current generating circuit. These structural elements are the same as those shown in FIG. 5. Here, the operational amplifier used in the amplification circuit 30 has the function of outputting a voltage up to approximately the same level as that of the supplied voltage.

Figure 5:
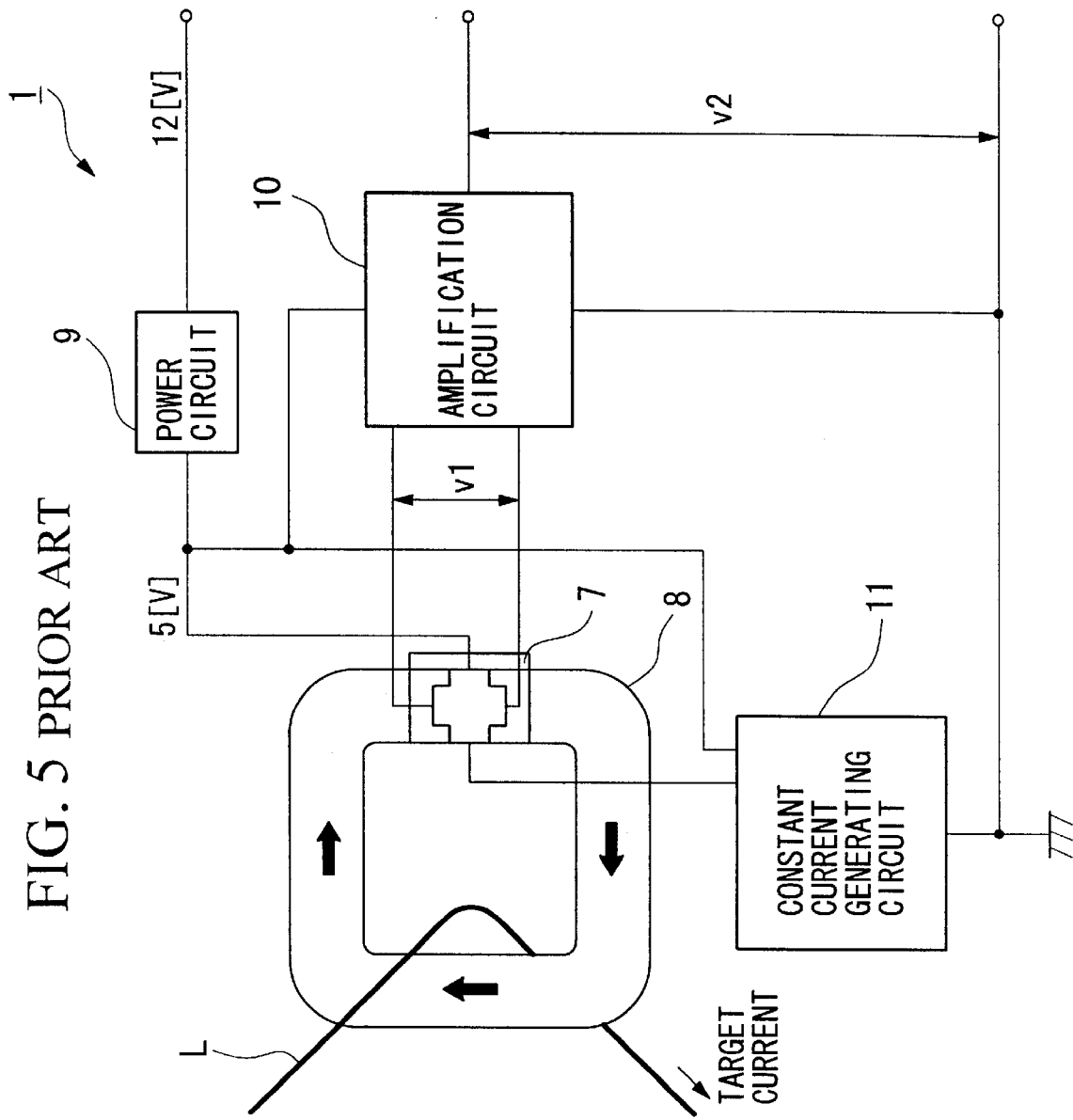
FIG. 5 is a block diagram showing the structure of a current sensor as a constituent of the current detector shown in FIG. 4.

The distinctive feature of the circuit shown in FIG. 2 in comparison with the circuit shown in FIG. 2 is that the power circuit 9 in FIG. 5 is omitted.

Figure 4:
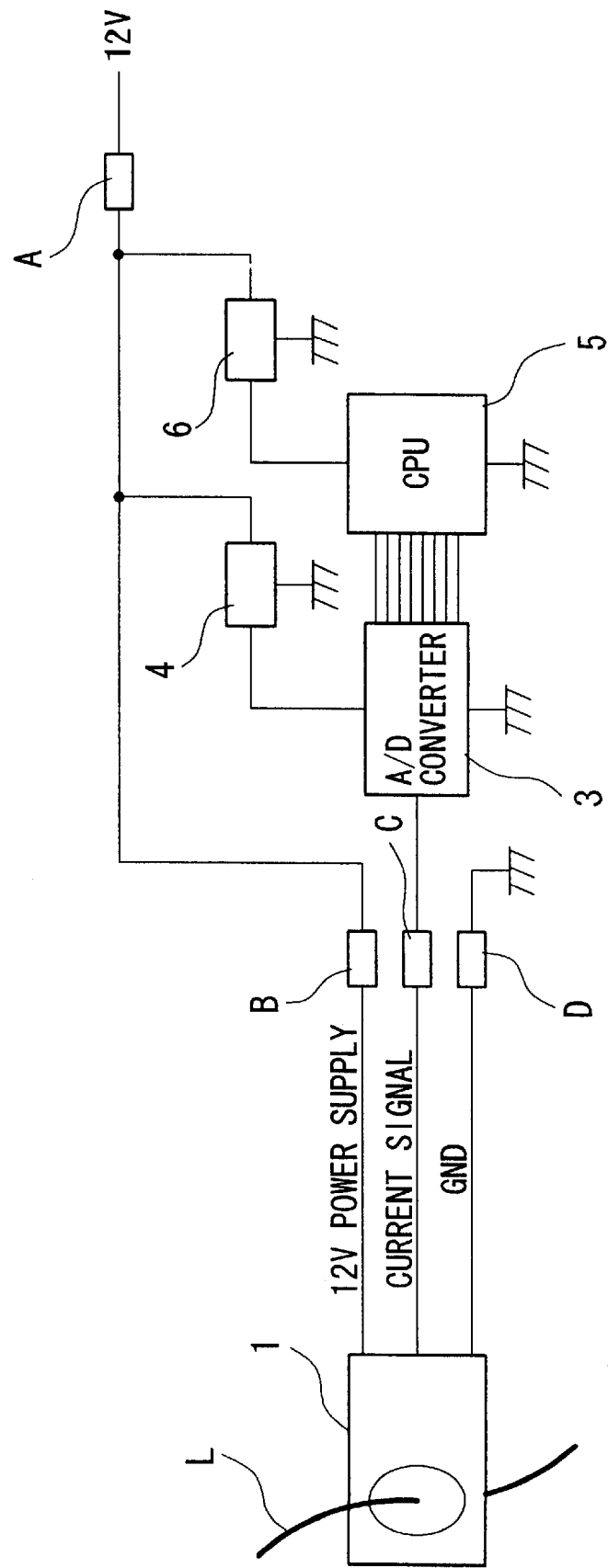
FIG. 4 is a block diagram showing the structure of a conventional current detector used in a control system for controlling a motor for driving a vehicle.

In FIG. 1, reference numeral 23 indicates an A/D converter, and reference numeral 25 indicates a CPU, and these elements are also the same as those shown in FIG. 4. Reference numeral 33 indicates a power circuit for converting input voltage (i.e., 12 V) to 5 V, and outputting the converted voltage. This power circuit 33 is not an especially accurate one.

As explained above, in the current detector 125u in the control system for controlling the motor for driving the vehicle, the output from the power circuit 33 is applied to both the A/D converter 33 and the constant current generating circuit 31.

Below, the operation of the sensor for controlling the motor, having the above-explained structure, will be explained.

The power circuit 33 converts the 12V-DC power supply voltage to 5V stabilized voltage Vs, and outputs the voltage Vs. As explained above, the power circuit 33 is not an especially accurate one; thus, it is assumed that the output voltage Vs changes within the range from 4.8 to 5.2 V due to variations in the 12V power source, variations in the temperature, or the like.

Figure 3:
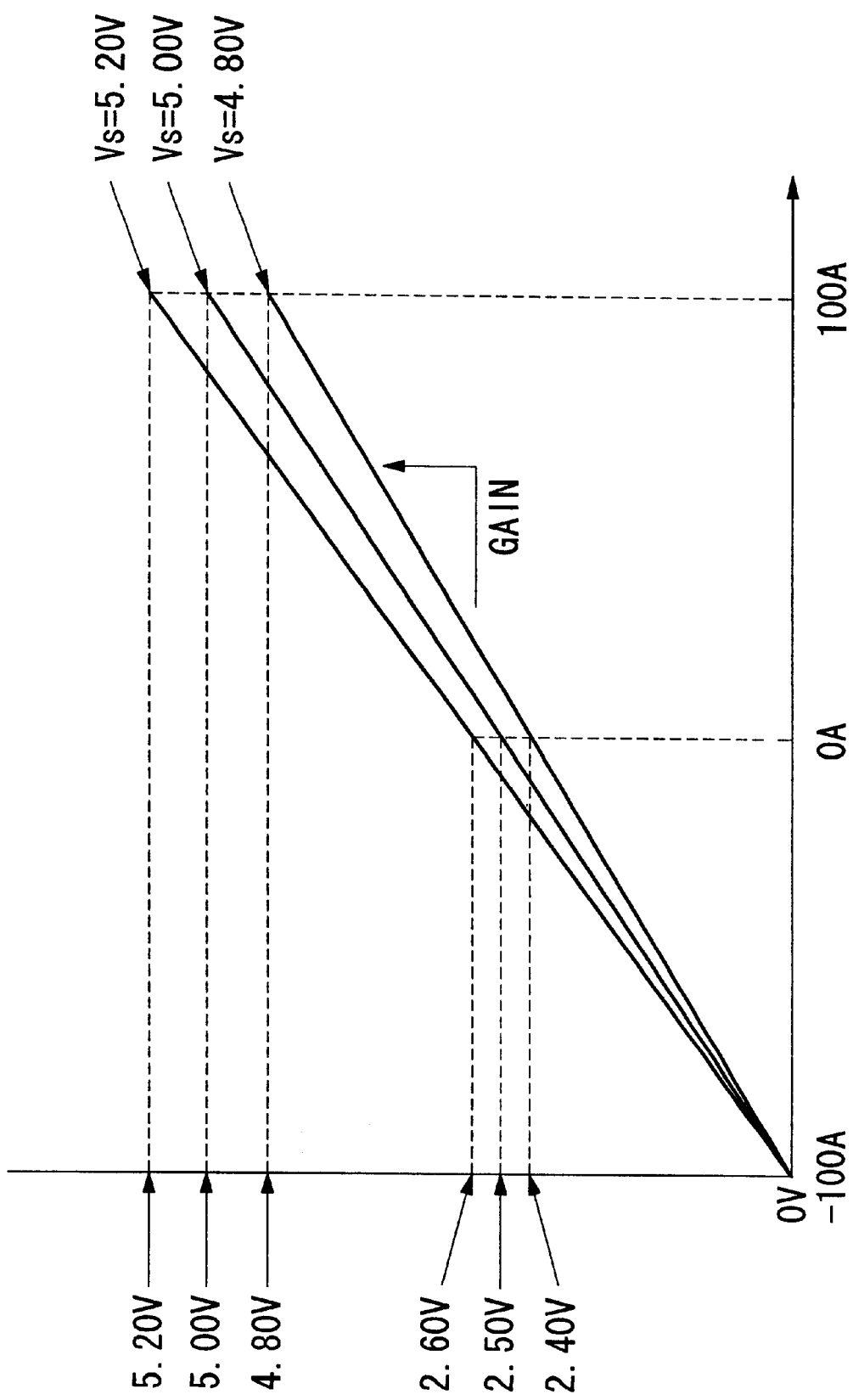
FIG. 3 is a graph showing the voltage output from amplification circuit 30 with respect to the current flowing through wire L.

If it is assumed that the target current to be detected is within the range from −100 A to +100 A, as shown in FIG. 3, the output from the amplification circuit 30 changes from 4.8 V to 5.2 V with respect to the maximum current 100A. Also with respect to the current below 100 A, the output voltage from the amplification circuit 30 changes due to variations in the voltage Vs. On the other hand, the voltage Vs is also applied to the A/D converter 23; thus, if the voltage Vs varies, then the reference voltage used for the A/D conversion varies in the same direction as that of the output voltage of the amplification circuit 30. As a result, the A/D converter is not affected by the variation of the voltage Vs, and outputs a stable conversion result regardless of the variation of the voltage Vs.

The current detector in the above embodiment can also be used as a current sensor 106a and 107b.

The embodiment of the present invention has been explained in detail with reference to the drawings, but specific embodiments are not limited to the above, and any design modification or variation is possible within the scope and spirit of the present invention.

What is claimed is:

1. A current detector used in a control system for controlling a motor for driving a vehicle comprising:
    a detector for outputting a voltage corresponding to a target current, wherein the detector has a current detecting element for detecting the target current;
    an amplifier for amplifying and outputting the output from the detector;
    an analog-digital converter for converting the output from the amplifier to a digital data; and
    a power circuit for converting a DC input voltage to a predetermined DC voltage and supplying the predetermined DC voltage to the detector, the amplifier, and the analog-digital converter, wherein:
        the predetermined DC voltage is applied to the current detecting element of the detector;
        the amplifier is driven by the predetermined DC voltage; and
        the target current does not flow through the power circuit.

2. A current detector as claimed in claim 1, wherein the detector comprises:
    a Hall element functioning as the current detecting element;
    a core for applying a magnetic flux corresponding to the target current to the Hall element; and
    a constant current generating circuit for supplying a constant current to the Hall element.

3. A current detector as claimed in claim 1, wherein the amplifier adds an offset voltage to the amplified voltage, and outputs the amplified voltage including the offset.

4. A current detector as claimed in claim 2, wherein the amplifier adds an offset voltage to the amplified voltage, and outputs the amplified voltage including the offset.

5. A current detector as claimed in claim 1, wherein the vehicle is a hybrid vehicle which uses the motor for assisting the output of an engine.

6. The current detector as claimed in claim 1, wherein the analog-digital converter calculates the ratio of the output from the amplifier to the predetermined DC voltage and converts the calculated result to a digital data.

* * * * *